United States Patent [19]
Bobeck et al.

[11] 3,934,235
[45] Jan. 20, 1976

[54] REACTIVE COUPLED DRIVE CIRCUIT FOR MAGNETIC BUBBLE MEMORIES

[75] Inventors: Andrew Henry Bobeck, Chatham; Donald Eugene Kish, Middlesex; Roman Kowalchuk, Somerville, all of N.J.

[73] Assignee: Bell Telephone Laboratories, Incorporated, Murray Hill, N.J.

[22] Filed: Nov. 4, 1974

[21] Appl. No.: 520,611

[52] U.S. Cl............................................ 340/174 TF
[51] Int. Cl.²......................................... G11C 11/14
[58] Field of Search ............................. 340/174 TF

[56] References Cited
UNITED STATES PATENTS

| | | | |
|---|---|---|---|
| 3,763,478 | 12/1973 | Yoshizawa et al. | 340/174 TF |
| 3,866,145 | 2/1975 | Hess, Jr. et al. | 340/174 TF |

*Primary Examiner*—James W. Moffitt
*Attorney, Agent, or Firm*—H. M. Shapiro

[57] ABSTRACT

The two drive coils commonly used for moving magnetic bubbles in a bubble memory are driven by a pair of reactive-coupled tuned circuits. The tuned circuits are designed to maintain the proper phase relationship between currents in the circuits and to provide periodic refresh pulses once operation is initiated.

7 Claims, 6 Drawing Figures

REACTIVE COUPLED DRIVE CIRCUIT FOR MAGNETIC BUBBLE MEMORIES

FIELD OF THE INVENTION

This invention relates to magnetic memories and more particularly to magnetic bubble memories operative in the field access mode.

BACKGROUND OF THE INVENTION

As is well known in the art, field-access operation of magnetic bubble memories employs a magnetic field which reorients, typically by rotation, in the plane in which bubble movement occurs. The rotating field generally is provided by two field coils oriented orthogonally to one another and physically encompassing the plane of movement. The coils are driven in quadrature by a pair of tuned circuits as described, for example, in copending application Ser. No. 443,960 filed Feb. 20, 1974, now U.S. Pat. No. 3,879,585, issued Apr. 22, 1975.

Bubble memories are known to be nonvolatile. That is to say, bubble memories retain information even when a power failure occurs. It is important, however, to ensure that the in-plane field stops and starts in the same orientation in order to avoid loss of information. Consequently, circuits generating the in-plane fields have required precise adjustment to ensure that they were properly energized and de-energized.

To be specific, information can be lost if energization of the bubble circuit does not occur at the precise point in the in-plane field cycle at which de-energization previously occurred. Loss occurs because when energization occurs, bubbles might be at positions with respect to the permalloy pattern to not move at all or to move incorrectly. Since the in-plane field is supplied by two coils driven in quadrature and since the coils constitute parts of two tuned circuits, a variation in the peak currents in the coils and/or the resonant frequencies of the tuned circuits causes the in-plane field to deviate from a constant amplitude, which deviation could result in a change in the phase relationship of the energization and de-energization signals thus increasing the risk of information loss.

In order to maintain peak currents in the two coils at constant amplitude, refresh pulses normally are applied to the tuned circuits during each cycle of the in-plane field. The refresh pulses, hitherto, have been supplied by an external clock which, because of the above considerations, itself had to be precisely set with respect to the phase of the in-plane field. Moreover, the tuned circuits were still subject to variations in their voltages which changed the phase relationship not only between the two tuned circuits but also between the two circuits and the clock. Consequently, considerable care (and expense) has been taken to supply properly timed refresh pulses and to avoid such variations.

During energization and de-energization, the shape of the in-plane field also is important. Ideally, the components of the in-plane field do not change from zero to full field strength simultaneously during energization but rather one component initiates its rise at the precise time the other component reaches its peak. During de-energization, a similar timing relationship also holds true. If the timed sequence is not observed, the resulting non-ideal build-up or decay of the field could, again, result in undesirable movement of bubbles and thus loss of information. The achievement of a suitably timed sequence of field component changes, properly timed refresh pulses, and the avoidance of voltage drift in the tuned circuits has required sophisticated control circuitry for bubble memory operation.

BRIEF DESCRIPTION OF THE INVENTION

We have recognized that during energization and de-energization of a bubble circuit, the in-plane field may be allowed to build up or decay relatively slowly in a manner such that bubbles oscillate about predetermined positions without the risk of information loss. Consequently, the requirements on the driving circuitry for the two field coils can be relaxed. We further recognized that because the field build-up or decay could be non-ideal, reactive coupled tuned circuits could be used to advantage to drive the bubble memory. Reactive coupled tuned circuits are characterized by a non-ideal slow build-up and decay of currents in coils within the circuits. Such circuits are also characterized by coil currents ninety degrees out of phase with one another if one circuit is a series tuned circuit and the other a parallel tuned circuit. Since a non-ideal waveform can be used during energization and de-energization of the bubble circuit, such circuits appear particularly well suited for driving bubble memories. Accordingly, a prime feature of this invention is the combination of a reactive coupled pair of tuned circuits and a magnetic bubble memory in which bubbles move responsive to a magnetic field provided by the coils in the two circuits. Refresh pulses can be extracted conveniently from the parallel tuned circuit to ensure constant peak currents in both coils in a manner which is self-correcting with variations in the voltage of the tuned circuits. Thus, a considerable reduction in control circuitry can be realized.

In one embodiment of this invention, first and second tuned circuits are transformer coupled. The first circuit is a series-tuned circuit; the second, a parallel-tuned circuit in which the voltage across its capacitor is in phase with the current in the first circuit. A start pulse initiates current flow in the first circuit. At the termination of the start pulse, a second start pulse is applied to charge the capacitor in the second circuit. The currents in the two circuits tend to retain a 90° phase relationship with respect to one another even if the resonant frequencies of the tuned circuits changes. The phase relationship is precisely maintained because the refresh pulses are extracted from the second circuit and applied to refresh the second circuit during each cycle.

DETAILED DESCRIPTION

Figure 1:
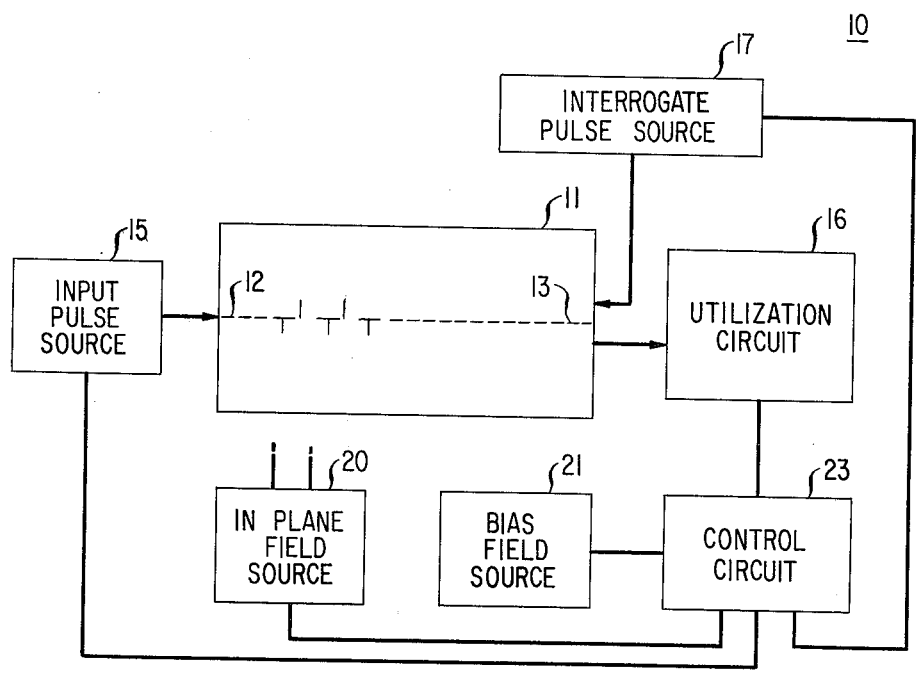
FIG. 1 is a schematic representation of a magnetic bubble memory operative in a field-access mode.

FIG. 1 shows a magnetic bubble memory 10 including a layer 11 of a material in which magnetic bubbles can be moved. Bubble movement occurs along channels defined by patterns of magnetically soft material such as permalloy in a field-access mode of operation disclosed in U.S. Pat. No. 3,534,347 of A. H. Bobeck, issued Oct. 13, 1970. For illustration purposes, the channel-defining pattern is shown comprising familiar T and bar-shaped elements in FIG. 1. A typical channel extends from an input position, indicated at 12, to an output position, indicated at 13, at which information is entered and detected by an input pulse source 15 and a utilization circuit 16, respectively. Output signals typically are obtained by means of a magneto-resistive element astride a laterally expanded portion of the channel and gated by an interrogate pulse applied to the element by pulse source 17 as is well known in the art.

Bubble propagation along a channel occurs in response to a magnetic field reorienting in the plane of layer 11. The magnetic field generates magnetic poles in the portions of the T and bar-shaped elements aligned with the field in each orientation. As the field reorients, the pole patterns change. The elements are disposed to present changing pole patterns which "move" domain patterns along the axis of the propagation channel. A source of the in-plane field is identified by block 20 in FIG. 1.

In practice, a bubble is maintained at an operating diameter by a bias field antiparallel to the direction of magnetization of the bubble. Bubble materials are characterized by a uniaxial anisotropy transverse, typically normal, to the plane of bubble movement. Accordingly, the bias field is directed normal to that plane. A bias field source is represented by block 21 in FIG. 1.

Sources 15, 17, 20, and 21 and circuit 16 are operative under the control of a control circuit 23. The various sources and circuits may be any such elements capable of operating in accordance with this invention.

Figure 2:
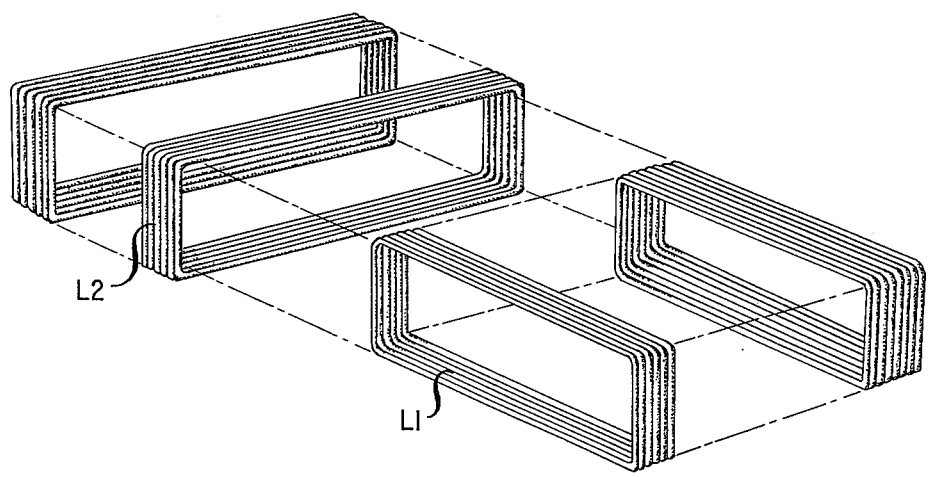
FIG. 2 is a schematic representation of a drive coil arrangement for the memory of FIG. 1.

In-plane field source 20 includes a pair of field coils represented as L1 and L2 in FIG. 2. The coils comprise tightly wound, multiple-layered wire arrangements designed to generate a uniform rotating field in a bubble layer placed within the coils. Note from FIG. 2 that coil L1 is smaller than coil L2 and is designed to fit within coil L2. Also note that the coils are oriented orthogonally with respect to one another. This is a well-known coil structure and organization for producing the rotating in-plane field characteristic of magnetic bubble, field-access operation.

Figure 3:
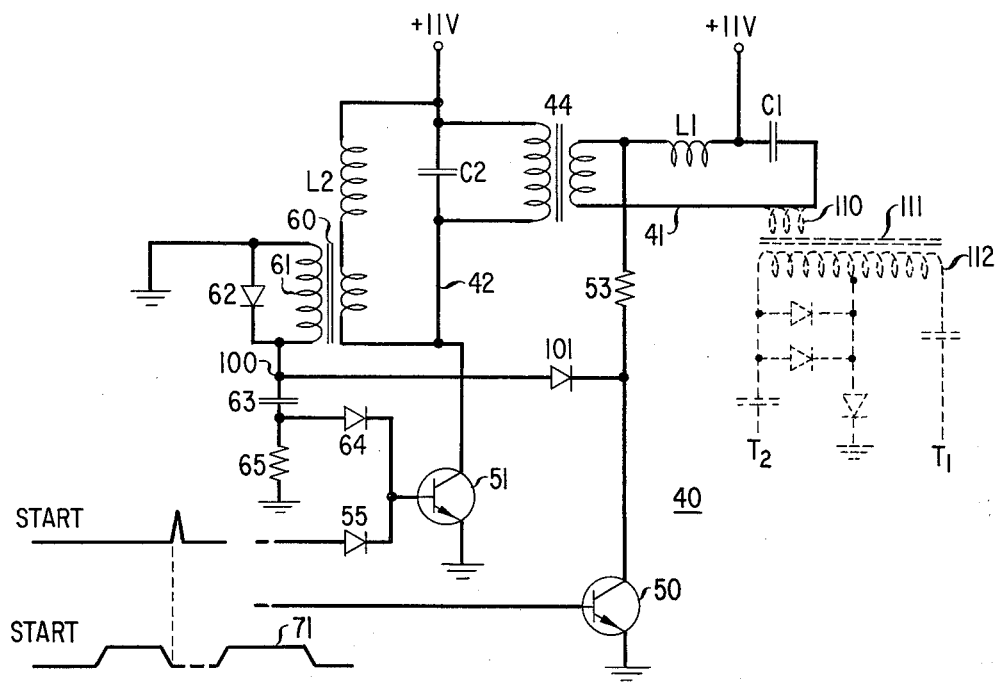
FIG. 3 is a diagram of an electronic circuit for driving the coils of FIG. 2 in accordance with this invention.

The coils are driven with sinusoidal current waveforms 90° out of phase with one another to produce the requisite field reorientation. FIG. 3 shows a drive circuit in accordance with this invention for so driving coils L1 and L2 of FIG. 2. The drive circuit includes first and second tuned circuit 41 and 42. The coils can be seen to constitute portions of tuned circuits 41 and 42, respectively. Coil L1 is connected electrically in series with a capacitor C1. Coil L2 is connected electrically in parallel with capacitor C2. The two tuned circuits are coupled together illustratively by transformer 44, the current in circuit 41 being in phase with the voltage across the capacitor in circuit 42 in accordance with well-understood principles. Once the tuned circuits are activated, they operate to impress in coils L1 and L2 sinusoidal current waveforms which tend to be maintained 90° out of phase with one another because of the cross coupling between the first and second circuits even though the resonant frequency of either circuit may vary or drift.

Activation of the tuned circuits occurs in response to the application of signals applied to transistors 50 and 51 of FIG. 3 by control circuit 23 of FIG. 1. The collector of transistor 50 is connected by means of resistor 53 to one side of coil L1. The other side of coil L1 is connected to a reference voltage illustratively of +11 volts. The emitter of transistor 50 is connected to ground. Similarly, the collector of transistor 51 is connected to one side of coil L2 and the other side of that coil also is connected to +11 volts. The emitter of transistor 51 is connected to ground.

The activation signals for the circuit of FIG. 3 are applied to the base electrodes of transistors 50 and 51. A first start pulse of the waveform shown in FIG. 3 is first applied to the base of transistor 50. At the termination of the first pulse, a second start pulse is applied to the base of transistor 51 via a diode 55. The first start pulse is operative to initiate current flow (I) in coil L1 shown as $I_{L1}$ in the pulse diagram of FIG. 4. The start pulse terminates leaving circuit 41 oscillating. The second start pulse charges capacitor C2 to peak voltage in essentially zero time (short duration compared to one period of the oscillating frequency) thus initiating a current flow $I_{L2}$ in FIG. 4 driving circuit 42 into resonance.

Once current flow is initiated in the tuned circuits, refresh signals are provided to make up for losses which occur in the circuits during each cycle of the in-plane field. The refresh signal comprises a refresh pulse for each cycle of the in-plane field and is derived from circuit 42 in FIG. 3. To this end, circuit 42 includes a transformer 60 in series with coil L2. The secondary winding 61 of transformer 60 is connected electrically in parallel with diode 62 between ground and a capacitor 63. Capacitor 63, in turn, is connected to the base electrode of transistor 51 by means of diode 64 and via a resistor 65 to ground. Transformer 60 is operative to apply a refresh pulse to the base of transistor 51 during each cycle of the in-plane field, capacitor 63 and diode 64 being operative to differentiate and to clip the refresh pulse, respectively.

Figure 5:
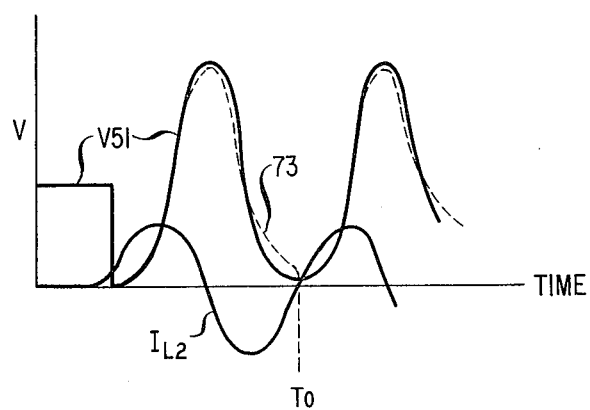

FIG. 5 is a pulse diagram showing a curve representing the voltage $V_{51}$ at the collector of transistor 51 in FIG. 3 during operation. The start pulse applied to transistor 51 is operative to drop the voltage to zero charging capacitance C2 as indicated by curve $V_{51}$. Due to losses in circuit 42, $V_{51}$ does not drop to zero during each cycle as indicated at $T_0$ in FIG. 5. Rather, the voltage follows the broken portion 73 of curve $V_{51}$. The refresh pulse occurs at time $T_0$ to return the voltage to zero. In other words, the occurrence of the refresh pulses at times $T_0$ ensures that the peak amplitudes of the current in coil L2 (and in coil L1) are maintained at a substantially uniform value over long periods of time. If a drift in resonant frequency occurs, no phase change occurs. Only a tolerable reduction in amplitudes of the currents in the coils occurs.

Figure 4:
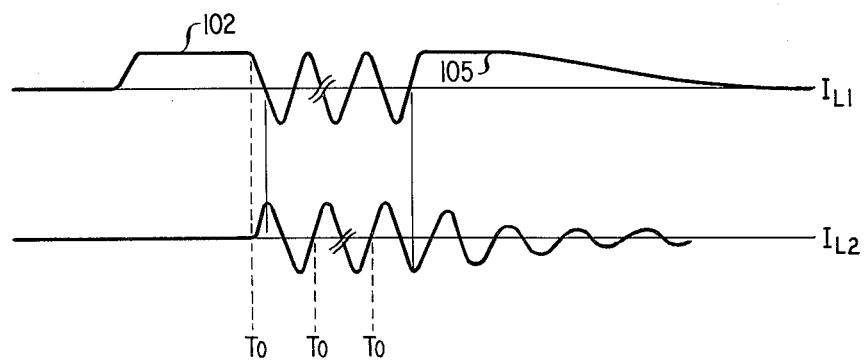
FIGS. 4 and 5 are pulse diagrams of the current and voltage waveforms in various elements of FIG. 3 during operation.

FIG. 4 shows the current $I_{L2}$ in coil L2. The refresh pulse occurs at positive-going zero crossings in the $I_{L2}$ waveform. At each of these crossings, transformer 60 goes through a zero current point following curve $I_{L2}$ of FIG. 5. Diode 62 clips the negative peak of the voltage (waveform) induced on secondary winding 61; diode 64 and transistor 51 clip the positive peak. The clipped waveform is next differentiated by the resistor 65-capacitor 63 combination. Diode 64 is used to allow current flow in transistor 51 only during the positive transition of point 100 in FIG. 3.

A diode 101 is connected between the collector of transistor 50 and diode 62 for the purpose of grounding point 100 in FIG. 3 when a subsequent (turn-off) pulse 71 is applied to the base of transistor 50. The grounding of point 100 inhibits subsequent refresh pulses and thus deactivates the driver.

The leading portion 102 of waveform $I_{L1}$ of FIG. 4 has a duration determined by the requirements of the bubble circuit. In the above-mentioned copending application, bubbles are generated in an expansion detector, characteristic of bubble memories, during operation. These bubbles are required to expand laterally quite rapidly. Since the in-plane field, in the application, is initiated synchronously with bubble generation, the duration of the portion is chosen sufficiently long to allow the bubble sufficient time to expand laterally before propagation commences.

Similarly, the trailing portion 105 of waveform $I_{L1}$, initiated by pulse 71 of FIG. 3, exhibits a rate of decline determined by the (low and high) Q's of circuits 41 and 42 (respectively) in a well-understood manner. Actually the decline of trailing portion 105 should be equal to or greater than a line through the progressively decreasing positive maxima of waveform $I_{L2}$ in FIG. 4 to ensure that the in-plane field rotates no more than ± 45° while its amplitude decays to zero. This ensures, in turn, the integrity of the bubble data stream, i.e., no undesirable bubble movement.

In FIG. 3, transformer 60 is shown connected in series with coil L2. As has been mentioned hereinbefore, the purpose of the circuit associated with the secondary of transformer 60 is to apply refresh pulses to transistor 51 thus fulfilling a clock function in a particularly attractive and convenient self-adjusting manner. Circuit 41 can be adapted to fulfill a similar function. For example, a primary winding 110 of a transformer 111, shown in phantom in the figure, can be connected electrically in series as shown. The secondary winding 112 applies signals via a clipping and differentiating circuit arrangement connected between the ends of the winding and a center tap as shown. The arrangement provides timing signals T1 and T2 which occur at the negative-going and positive-going zero points in waveform $I_{L1}$ of FIG. 4. Such timing pulses are required by logic circuitry controlling operation of a bubble memory as, for example, a repertory dialer disclosed in the above-mentioned copending application. Accordingly, a transformer coupled arrangement of a series and a parallel-tuned circuit as described may function not only as a driver circuit for the drive coils for a bubble memory but also conveniently as a clock and timing pulse distributor.

Circuits of the type described exhibit significant additional virtues. For example, as can be seen in FIG. 2, coil L1 is physically smaller than coil L2. Consequently, different inductances, different currents, and different voltages have been characteristic of a drive circuit including the two coils. In accordance with the present invention, a single power supply voltage determines the currents. Moreover, the smaller coil (L1) is in series resonance. Thus, since the tuned circuits are transformer coupled, the voltage across the large coil and the turns ratio of the transformer 44 determines the current in coil L1. Moreover, the two circuits are maintained in phase even though their resonant frequencies may vary, current amplitudes varying to compensate for the energy loss which occurs in such cases.

In practice, coils L1 and L2 for a repertory dialer application of the type shown in the above-mentioned copending application and driven by a drive circuit in accordance with this invention had the following specifications:

L1 parameters based on 35 samples
$R_{DC} = 24 \pm 2 \, \Omega$
$L = 166 \pm 10 \, \mu H$
$Q \cong 3$ (measured on coil prior to assembly)
$I = 60 \pm 5$ ma L2 parameters based on 31 samples
$R_{DC} = 10.5 \pm 1.0 \, \Omega$
$L = 248 \pm 15 \, \mu H$
$Q = 14$ (measured on coil prior to assembly)
$I = 130 \pm 10$ ma (peak-peak)

The bubble chip in the dialer was a 1924 bit chip mounted onto a 32-pin dual-in-line pack as disclosed in copending application Ser. No. 470,410 filed May 16, 1974 now abandoned for A. H. Bobeck, B. H. McGahey, W. M. Melbert, Jr., T. B. Prince, and M. J. Stevenson. The in-plane field rotated at 100 kHz. Capacitances (C1 and C2 of FIG. 3) were $0.02 \mu f$ and $0.01 \mu f$, respectively. Transformer 44 had a turns ratio of 13:120 with 13 turns on the L1C1 side and 120 turns on the L2C2 side. Transformer 60 had a turns ratio of 30:6. The ramp pulses applied to transistor 50 were characterized by rise times of $1 \mu sec$. durations of $50 \mu sec$. and a trailing edge of $1 \mu sec$. The start pulse had an amplitude of 5 volts and a duration of $0.2 \mu sec$. The refresh pulses had an amplitude of 3 volts and a duration of $0.2 \mu sec$.

The circuit of FIG. 4 provided a minimum rotating field of about 30 oersteds at the 100 kHz cycle time.

Figure 6:
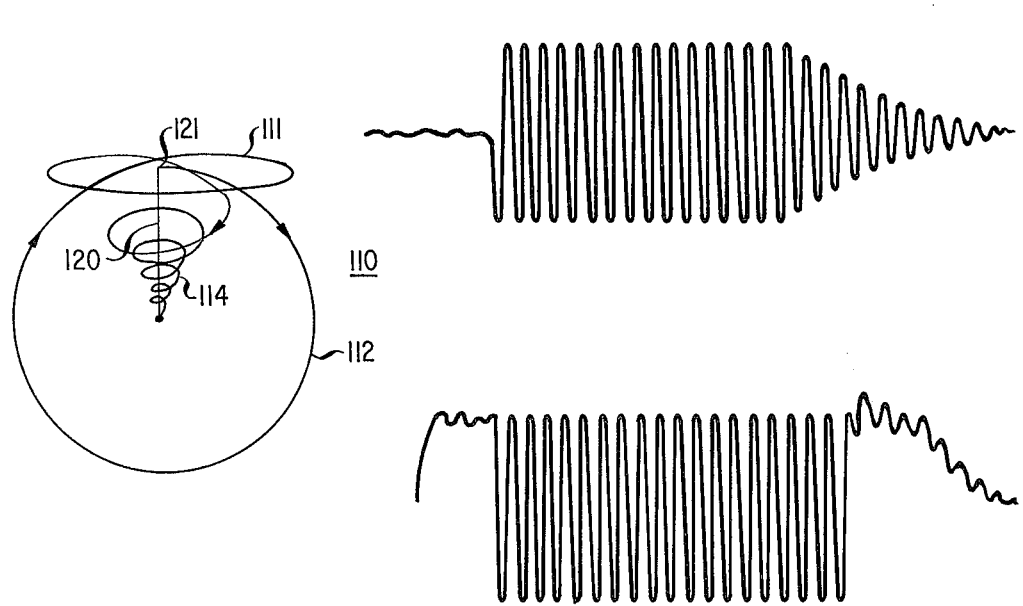
FIG. 6 is a diagram of an oscilloscope output of current waveforms in illustrative coils of the type employed for the circuit of FIG. 3.

FIG. 6 shows a diagram of an actual oscilloscope output of the various coil currents as well as a polar representation 110 of the outer coil (L2) current (horizontal) versus the inner coil (L1) current (vertical) during a typical 14 cycle start end stop burst at 100 kHz. The outer coil current waveform is shown in the upper right, as viewed in the figure. The inner coil current waveform is shown at the lower right. The polar representation indicates, at 111, a substantial overshoot in the current in the coils beyond the prescribed steady state value (corresponding to about 28 to 30 oersteds) during de-energization before the coil current (and thus the in-plane field) decays (via curve 114) to zero.

During energization current builds up via line 120, overshoots, at 121, the (eventual) steady state value, and then assumes the steady state value. No loss of information occurred.

Although the invention has been described in terms of a transformer-coupled tuned circuit implementation, capacitor-coupled tuned circuits may be employed also. In such a case, the refresh pulses may be referenced, for example, to either zero current or zero voltage crossings preferably in the coil of the parallel tuned circuit.

The timing pulses typically are applied to additional transistors (not shown) in practice to bring the amplitudes of the pulses to logic levels in accordance to well-known techniques.

What has been described is considered merely illustrative of the principles of this invention. Accordingly, varied modifications of this invention can be devised by those skilled in the art in accordance with those principles within the spirit and scope of the invention as encompassed by the following claims.

What is claimed is:

1. A combination comprising a field-access magnetic bubble memory in which bubbles may be made to move in a plane of movement and a driver circuit having first and second coils for providing a magnetic field reorienting in said plane, said driver circuit further comprising first and second tuned circuits, said first tuned circuit comprising a first capacitor and said first coil connected electrically in series, said second tuned circuit comprising a second capacitor and said second coil connected electrically in parallel, and means for reactively coupling said first and second tuned circuits.

2. A combination in accordance with claim 1 in which said means for reactively coupling said first and second tuned circuits comprises a transformer having secondary and primary windings in said first and second circuits, respectively.

3. A combination in accordance with claim 2 further including first and second means responsive to first and second start signals for initiating first and second sinusoidal currents in said first and second circuits, respectively, said first and second circuits being operative to maintain said currents 90° out of phase with one another.

4. A combination in accordance with claim 3 wherein said second means comprises a transistor having a base electrode, said second circuit including a primary winding of transformer in series with said second coil, the secondary winding of said transformer being adapted to apply a refresh signal to said base electrode during each cycle of said rotating field.

5. A combination in accordance with claim 4 wherein said first coil is arranged orthogonal with respect to said second coil and disposed physically therewithin.

6. A combination in accordance with claim 5 wherein said magnetic bubble memory is encompassed by said first coil, said memory including a periodic pattern of elements adjacent said plane of movement for defining a channel for the movement of bubbles therein, said elements being responsive to said magnetic field reorienting in said plane for providing magnetic poles for moving bubbles along said channel.

7. A combination in accordance with claim 6 including means for deactivating said second circuit.

* * * * *